(12) United States Patent
Kim

(10) Patent No.: US 7,439,089 B2
(45) Date of Patent: Oct. 21, 2008

(54) METHOD OF FABRICATING ARRAY SUBSTRATE HAVING COLOR FILTER ON THIN FILM TRANSISTOR STRUCTURE

(75) Inventor: Dong-Guk Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 330 days.

(21) Appl. No.: 11/438,500

(22) Filed: May 22, 2006

(65) Prior Publication Data

US 2006/0216843 A1    Sep. 28, 2006

Related U.S. Application Data

(62) Division of application No. 10/880,274, filed on Jun. 29, 2004, now Pat. No. 7,075,110.

(30) Foreign Application Priority Data

Jun. 30, 2003    (KR) .......................... 2003-0043961

(51) Int. Cl.
*H01L 21/00* (2006.01)

(52) U.S. Cl. .......... 438/30; 257/E21.703; 257/E27.111; 257/32; 257/38; 257/88; 257/89; 349/43

(58) Field of Classification Search .................. 438/30; 257/E21.703, E27.111; 349/43
See application file for complete search history.

(56) References Cited

U.S. PATENT DOCUMENTS

| | | | | |
|---|---|---|---|---|
| 6,162,654 A * | 12/2000 | Kawabe | .......................... | 438/30 |
| 6,243,146 B1 * | 6/2001 | Rho et al. | ....................... | 349/42 |
| 6,873,382 B2 * | 3/2005 | Chang et al. | ................. | 349/106 |
| 7,190,419 B2 * | 3/2007 | Park | ............................. | 349/43 |
| 2001/0002857 A1 * | 6/2001 | Shimada et al. | .............. | 349/138 |
| 2001/0010567 A1 * | 8/2001 | Rho et al. | ....................... | 349/43 |
| 2004/0124414 A1 * | 7/2004 | Jang et al. | ...................... | 257/59 |
| 2004/0126917 A1 * | 7/2004 | Yoo et al. | ....................... | 438/30 |
| 2004/0179157 A1 * | 9/2004 | Kim et al. | .................... | 349/114 |
| 2007/0064179 A1 * | 3/2007 | Park et al. | .................... | 349/110 |

* cited by examiner

*Primary Examiner*—Matthew S. Smith
*Assistant Examiner*—Jarrett J Stark
(74) *Attorney, Agent, or Firm*—Brinks Hofer Gilson & Lione

(57) ABSTRACT

In a liquid crystal display device substrate, an insulating layer covers a thin film transistor. Another insulating layer covers a black matrix, which is formed on the insulating layer and covers the thin film transistor, a gate line, and a data line except a portion of a drain electrode. A first transparent conductive layer covers the top insulating layer and contacts the exposed portions of the drain electrode, a gate pad and a data pad. A buffer layer is formed on the first conductive layer and a color filter is formed on the buffer layer. The buffer layer is exposed by the color filter to reveal portions of the first conductive layer. A second transparent conductive layer covers the color filter and the revealed portions of the first conductive layer. The conductive layers are patterned to form pixel electrodes and double-layered gate and data pad terminals.

31 Claims, 22 Drawing Sheets

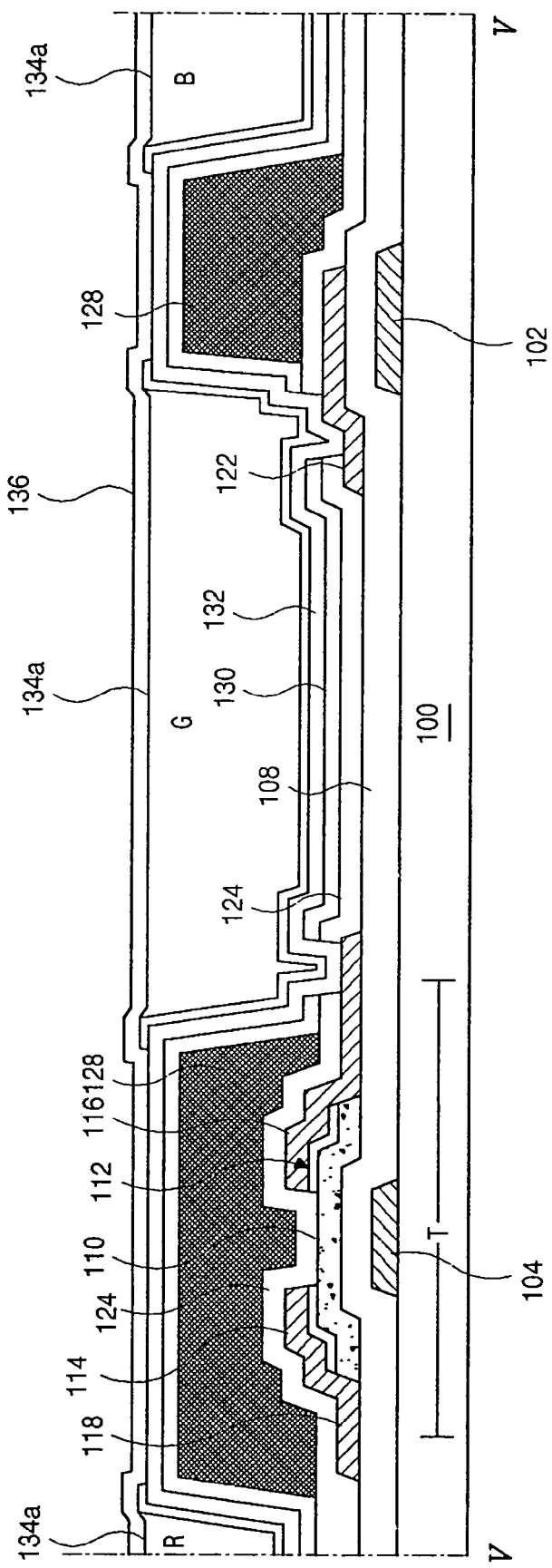

METHOD OF FABRICATING ARRAY SUBSTRATE HAVING COLOR FILTER ON THIN FILM TRANSISTOR STRUCTURE

This application is a divisional of application Ser. No. 10/880,274, filed on Jun. 29, 2004 now U.S. Pat, No. 7,075,110, which claims the benefit of Korean Patent Application 2003-0043961, filed on Jun. 30, 2003, both of which are incorporated herein by reference.

The present invention claims the benefit of Korean Patent Application No. P2003-0043961 filed in Korea on Jun. 30, 2003, which is hereby incorporated by reference.

BACKGROUND OF THE INVENTION

1. Field of the Invention

The present invention relates to a display device and a method of fabricating a display device, and more particularly, to an array substrate of a liquid crystal display device and a method of making an array substrate of a liquid crystal display device.

2. Discussion of the Related Art

In general, since flat panel display devices are thin, light weight, and have low power consumption, they are commonly used as displays of portable electronic devices. Among the various types of flat panel display devices, liquid crystal display (LCD) devices are commonly used for laptop computers and desktop computer monitors because of their superior resolution and their ability to produce high quality colored images.

Operation of the LCD devices makes use of optical anisotropy and polarization properties of liquid crystal molecules to generate a desired image. The liquid crystal molecules have a specific alignment due to their specific characteristics that can be modified by induced electric fields. For example, the electric fields induced to the liquid crystal molecules can change the alignment of the liquid crystal molecules, and due to the optical anisotropy of the liquid crystal molecules, incident light is refracted according to the alignment of the liquid crystal molecules.

The LCD devices include upper and lower substrates having electrodes that are spaced apart and face into each other, and a liquid crystal material is interposed therebetween. Accordingly, when the electric field is induced to the liquid crystal material through the electrodes of each substrate, an alignment direction of the liquid crystal molecules is changed in accordance with the applied voltage to display images. By controlling the induced voltage, the LCD device provides various light transmittances to display image data.

Among the different types of LCD devices, active matrix LCDs (AM-LCDs) having thin film transistors and pixel electrodes arranged in a matrix form provide high resolution images and superior moving images. A typical LCD panel has an upper substrate, a lower substrate, and a liquid crystal material layer interposed therebetween. The upper substrate, which is commonly referred to as a color filter substrate, includes a common electrode and color filters, and the lower substrate, which is commonly referred to as an array substrate, includes switching elements, such as thin film transistors (TFT's) and pixel electrodes.

FIG. 1 is an expanded perspective view of a liquid crystal display device according to the related art. In FIG. 1, an LCD device 11 includes an upper substrate 5, which is commonly referred to as a color filter substrate, and a lower substrate 22, which is commonly referred to as an array substrate, having a liquid crystal material layer 14 interposed therebetween. A black matrix 6 and a color filter layer 8 are formed in a shape of an array matrix on the upper substrate 5 that includes a plurality of red (R), green (G), and blue (B) color filters surrounded by the black matrix 6. In addition, a common electrode 18 is formed on the upper substrate 5 to cover the color filter layer 8 and the black matrix 6.

A plurality of thin film transistors T are formed in an array matrix corresponding to the color filter layer 8 on the lower substrate 22. A plurality of crossing gate lines 13 and data lines 15 are perpendicularly positioned such that each TFT T is located adjacent to each intersection of the gate lines 13 and the data lines 15. Furthermore, a plurality of pixel electrodes 17 are formed on a pixel region P defined by the gate lines 13 and the data lines 15 of the lower substrate 22. The pixel electrode 17 includes a transparent conductive material having high transmissivity, such as indium-tin-oxide (ITO) or indium-zinc-oxide (IZO).

In FIG. 1, a storage capacitor C is disposed to correspond to each pixel P and is connected in parallel to each pixel electrode 17. The storage capacitor C comprises a portion of the gate line 13, which functions as a first capacitor electrode, a storage metal layer 30, which functions as a second capacitor electrode, and an interposed insulator 16 (in FIG. 2). Since the storage metal layer 30 is connected to the pixel electrode 17 through a contact hole, the storage capacitor C electrically contacts the pixel electrode 17.

Accordingly, a scanning signal is supplied to a gate electrode of the thin film transistor T through the gate line 13, and a data signal is supplied to a source electrode of the thin film transistor T through the data line 15. As a result, liquid crystal molecules of the liquid crystal material layer 14 are aligned and arranged by enablement of the thin film transistor T, and incident light passing through the liquid crystal layer 14 is controlled to display an image. For example, the electric fields induced between the pixel and common electrodes 17 and 18 re-arrange the liquid crystal molecules of the liquid crystal material layer 14 so that the incident light can be controlled to display the desired images in accordance with the induced electric fields.

When fabricating the LCD device 11 of FIG. 1, the upper substrate 5 is aligned with and attached to the lower substrate 22. However, the upper substrate 5 may be misaligned with the lower substrate 22 and light leakage may occur due to a marginal error in attaching the upper and lower substrate 5 and 22.

FIG. 2 is a schematic cross-sectional view along II-II of FIG. 1 showing a pixel of a liquid crystal display device according to the related art. In FIG. 2, the LCD device includes the upper substrate 5, the lower substrate 22, and the liquid crystal layer 14. The upper and lower substrates 5 and 22 are spaced apart from each other and the liquid crystal layer 14 is interposed therebetween. The thin film transistor T is formed on the front surface of the lower substrate 22 and includes a gate electrode 32, an active layer 34, a source electrode 36, and a drain electrode 38. In addition, a gate insulation layer 16 is interposed between the gate electrode 32 and the active layer 34 to protect the gate electrode 32 and the gate line 13. As shown in FIG. 1, the gate electrode 32 extends from the gate line 13 and the source electrode 36 extends from the data line 15. The gate, source, and drain electrodes 32, 36, and 38 are formed of a metallic material while the active layer 34 is formed of silicon. Furthermore, a passivation layer 40 is formed on the thin film transistor T for protection. The pixel electrode 17 is formed of a transparent conductive material and is disposed on the passivation layer 40 while contacting the drain electrode 38 and the storage metal layer 30.

As previously described, the gate line 13 functions as a first electrode of the storage capacitor C and the storage metal layer 30 functions as a second electrode of the storage capacitor C. Thus, the gate electrode 13 and the storage metal layer 30 constitute the storage capacitor C with the interposed gate insulation layer 16.

In FIG. 2, the upper substrate 5 is spaced apart from the lower substrate 22 over the thin film transistor T. On a rear surface of the upper substrate 5, the black matrix 6 is disposed in positions corresponding to the thin film transistor T, the gate line 13, and the data line 15. For example, the black matrix 6 is formed along an entire surface of the upper substrate 5 and has openings corresponding to the pixel electrode 17 of the lower substrate 22, as shown in FIG. 1. The black matrix 6 prevents light leakage except for portions of the pixel electrode 17 and protects the thin film transistor T from the light, thus preventing generation of photo current in the thin film transistor T. The color filter layer 8 is formed on the rear surface of the upper substrate 5 to cover the black matrix 6 and includes red 8a, green 8b, and blue 8c colors filters, each corresponding to one pixel region P where the pixel electrode 17 is located. In addition, a common electrode 18 formed of a transparent conductive material is disposed on the color filter layer 8 over the upper substrate 5.

In FIG. 2, the pixel electrode 17 has a one-to-one correspondence with one of the color filters 8a, 8b, and 8c. Furthermore, in order to prevent a cross-talk between the pixel electrode 17 and the gate and data lines 13 and 15, the pixel electrode 17 is spaced apart from the data line 15 by a distance A and from the gate line 13 by a distance B. Accordingly, open spaces within the distances A and B between the pixel electrode 17 and the data and gate line 15 and 13 cause light leakage in the LCD device. For example, the light leakage mainly occurs within the open spaces A and B so that the black matrix 6 formed on the upper substrate 5 should cover those open spaces A and B. However, when arranging the upper substrate 5 with the lower substrate 22 or vice versa, a misalignment may occur between the upper substrate 5 and the lower substrate 22. Thus, the black matrix 6 is extended to fully cover those open spaces A and B to provide an aligning margin to prevent light leakage. However, by extending the black matrix, an aperture ratio of the liquid crystal panel is reduced as much as the aligning margin of the black matrix 6. Moreover, if there are errors in the aligning margin of the black matrix 6, the light leakage still occurs in the open spaces A and B, and deteriorates the image quality of the LCD device.

To overcome such disadvantages, an array substrate having a color filter-on-thin film transistor (COT) structure has been suggested.

FIG. 3 is a cross sectional view illustrating a known array substrate having a color filter-on-thin film transistor (COT) structure.

As shown in FIG. 3, a gate line 54 and a gate electrode 52 are disposed on a substrate 50. Then, a gate insulating layer 56 is formed on the substrate 50 to cover the gate line 54 and electrode 52. An active layer 58 and an ohmic contact layer 60 are disposed in series on the gate insulating layer 56, especially over the gate electrode 53. On the ohmic contact layer 60, formed are source and drain electrodes 62 and 64 that are spaced apart from each other across the gate electrode 52. Although not shown in FIG. 3, the gate electrode 52 extends from the gate line 54, and the source electrode 62 extends from a data line (not shown). A storage metal layer 68 having an island shape is formed on the gate insulating layer 56 and overlaps a portion of the gate line 54. Accordingly, a thin film transistor T having the gate electrode 52, the active layer 58, the ohmic contact layer 60, the source electrode 62 and the drain electrode 64 is complete. Furthermore, a storage capacitor $C_{ST}$ including the storage metal 68, the portion of the gate line 54 and the interposed gate insulating layer 56 is complete. A passivation layer 70 is disposed on the gate insulating layer 56 to cover the thin film transistor T and the storage capacitor $C_{ST}$. The passivation layer 70 is formed of silicon nitride ($SiN_X$) or silicon oxide ($SiO_2$), and has contact holes exposing portions of the drain electrode 64 and the storage metal layer 68. A black matrix 72 is disposed on the passivation layer 70 to cover the data line (not shown), the gate line 54 except the portion overlapped by the storage metal layer 68, and the thin film transistor T except the portion of drain electrode 64. The black matrix 72 is formed by way of coating and developing black resin. A color filter layer 74 having red (R) 74a, green (G) 74b and blue (B) 74c colors is formed on the passivation layer 70 to cover the black matrix 72. The color filter layer 74 also has contact holes that expose the portions of the drain electrode 64 and storage metal layer 68. An overcoat layer 76 is formed over an entire surface of the substrate 50 to cover the color filter layer 74. The overcoat layer 76 also has contact holes that expose the portion of the drain electrode 64 and storage metal layer 68. A transparent pixel electrode 80 is formed on the overcoat layer 76 and contacts both the drain electrode 64 and the storage metal layer 68 through the contact holes.

In the array substrate having the COT structure, as shown in FIG. 3, since the overcoat layer 76 is disposed between the color filter layer 74 and the pixel electrode 80, the process of forming the contact hole through the overcoat layer 76 is required in order to electrically connect the pixel electrode 80 to the thin film transistor T and storage capacitor $C_{ST}$. Furthermore, when forming the contact holes, problems are encountered that raise the cost of production and lower the process yield.

SUMMARY OF THE INVENTION

A method of fabricating an array substrate for a liquid crystal display device that provides a high aperture ratio is presented.

The method of forming an array substrate for a liquid crystal display device also has simplified and stabilized fabricating processes to increase manufacturing yield.

In one embodiment, a method of forming an array substrate in a liquid crystal display device includes forming a gate line on a substrate along a first direction, a gate pad at one end of the gate line, and a gate electrode extending from the gate line; forming a first gate insulating layer on the substrate to cover the gate line, the gate pad, and the gate electrode; forming an active layer of intrinsic amorphous silicon and an ohmic contact layer of extrinsic amorphous silicon layer sequentially on the first gate insulating layer over the gate electrode; forming a data line, a data pad, a source electrode, and a drain electrode, the data line disposed extending along a second direction to perpendicularly cross the gate line to define a pixel region, the data pad disposed at one end of the data line, the source electrode extending from the data line on a first portion of the ohmic contact layer, and the drain electrode spaced apart from the source electrode on a second portion of the ohmic contact layer to form a thin film transistor; forming a second insulating layer over an entire surface of the substrate to cover the thin film transistor; forming a black matrix on the second insulating layer to cover the thin film transistor, the gate line, and the data line except a portion of the drain electrode; forming a third insulating layer over an entire surface of the substrate to cover the black matrix; patterning the first, second, and third insulating layers to form first to third contact holes, wherein the first contact hole exposes the portion of the drain electrode, the second contact hole exposes a portion of the gate pad, and the third contact hole exposes a portion of the data pad; forming a first transparent conductive layer over an entire surface of the substrate to cover the patterned third insulating layer and contacting the exposed portions of the drain electrode, gate pad and data pad; forming a buffer layer on the first transparent conductive layer; forming a color filter on the buffer layer within the pixel region; etching portions of the buffer layer exposed by the color filter to reveal portions of the first transparent conductive layer; forming a second transparent conductive layer over an entire surface of the substrate to cover the color filter and the revealed portions of the first transparent conductive layer; and patterning the first and second transparent conductive layers to form first and second pixel electrodes, a double-layered gate pad terminal, and a double-layered data pad terminal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 5A-5H are cross-sectional views along V-V of FIG. 4 showing exemplary fabrication process steps according to the embodiment;

DETAILED DESCRIPTION OF THE PREFERRED EMBODIMENTS

Reference will now be made in detail to the illustrated embodiments of the present invention, examples of which are illustrated in the accompanying drawings. Wherever possible, the same reference number will be used throughout the drawings to refer to the same or like parts.

Figure 4:
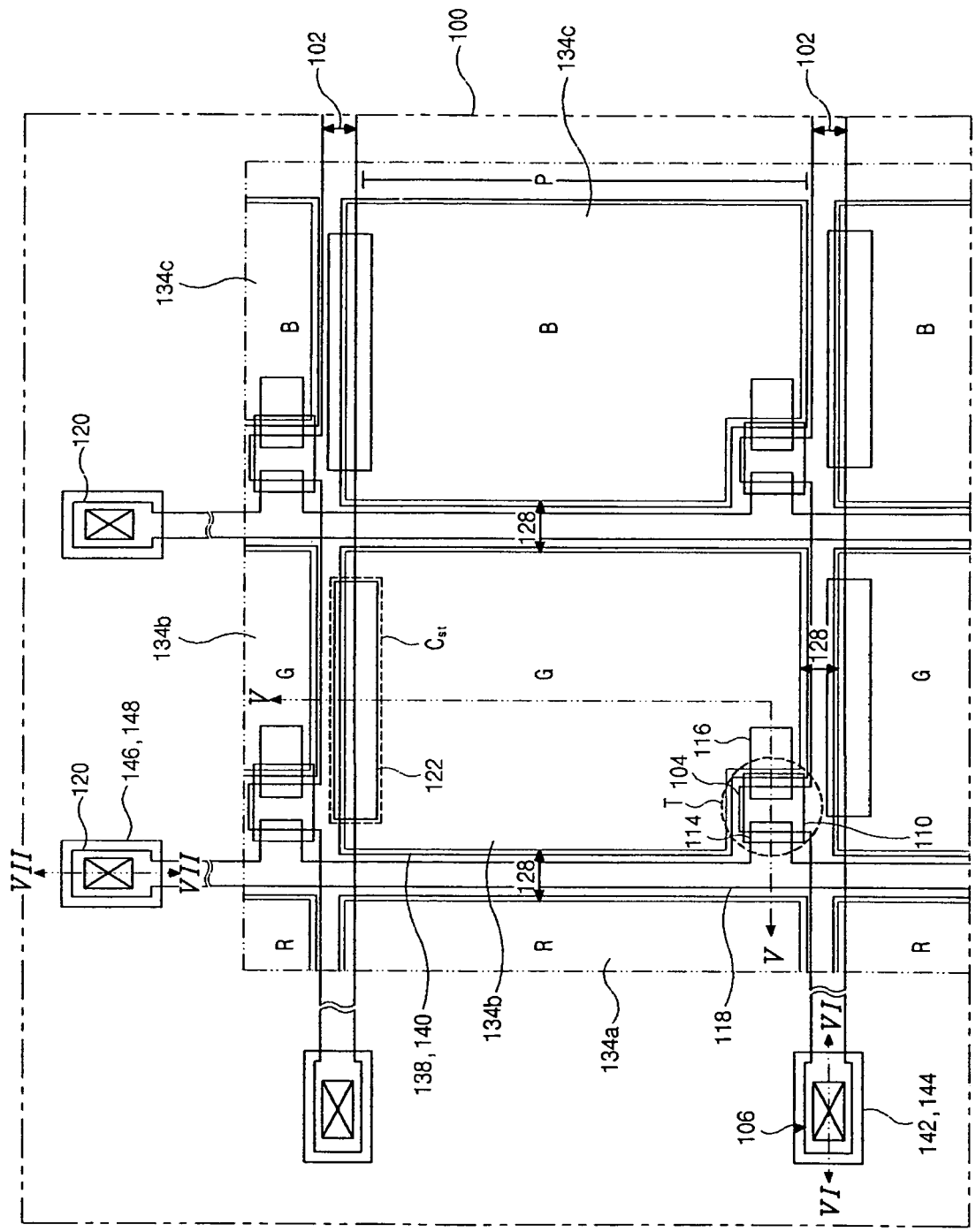
FIG. 4 is a partially enlarged plan view of an exemplary array substrate according to an embodiment of the present invention.

FIG. 4 is a partially enlarged plan view of an exemplary array substrate according to the present invention.

In FIG. 4, an array substrate 100 may include a plurality of gate lines 102 disposed along a transverse direction and a plurality of data lines 118 disposed along a longitudinal direction. The plurality of gate lines 102 and the plurality of data lines 118 cross one another to define pixel regions P. Each gate line 102 and each data line 118 may include a gate pad 106 and a data pad 120, respectively, disposed at ends of each gate line 102 and at ends of each data line 118. Over the gate pad 106, is disposed a double-layered gate pad terminal having first and second gate pad electrodes 142 and 144. Over the data pad 120, is disposed a double-layered data pad terminal having first and second data pad electrodes 146 and 148. In addition, a thin film transistor T may be formed at each crossing portion of the gate line 102 and the data line 118, and may include a gate electrode 104, an active layer 110, a source electrode 114, and a drain electrode 116.

Within the pixel regions P defined by the plurality of gate lines and data lines 102 and 118, a plurality of red (R), green (G), and blue (B) color filters 134a, 1134b, and 134c may be located therein. In addition, a double-layered pixel electrode structure including first and second pixel electrodes 138 and 140 may be disposed corresponding to each pixel region P. The first pixel electrode 138 and the second pixel electrode 140 may have similar shapes. Alternatively, the first pixel electrode 138 and the second pixel electrode 140 may have dissimilar shapes. Although not shown, the first pixel electrode 138 may be disposed beneath the color filter 134 and may contact the drain electrode 116, and the second pixel electrode 140 may be disposed on the color filter 134 and may contact the first pixel electrode 138. Accordingly, the color filter 134 may be located between the first and second pixel electrodes 138 and 140, and the second pixel electrode 140 may electrically contact the drain electrode 116 through the first pixel electrode 138.

Still in FIG. 4, a storage capacitor $C_{st}$ may be provided within a portion of the gate line 102 and a storage metal layer 122. Accordingly, the portion of the gate line 102 may function as a first electrode of the storage capacitor $C_{st}$, and the storage metal layer 122 may function as a second electrode of the storage capacitor $C_{st}$. In addition, the first and second pixel electrodes 138 and 140 may electrically contact the storage metal layer 122 such that they may be electrically connected to the storage capacitor $C_{st}$ in parallel.

In FIG. 4, the array substrate 100 may include a color filter-on-thin film transistor (COT) structure. In such a COT structure, a black matrix 128 and the color filters 134 may be formed on the array substrate 100. The black matrix 128 may be disposed to correspond in position to the thin film transistors T, the gate lines 102, and the data lines 118 to prevent light leakage in the LCD device. The black matrix 128 may be formed of an opaque organic material, thereby blocking the light incident to the thin film transistors T and protecting the thin film transistors T from external impact.

Although not shown in FIG. 4, an inorganic insulator is formed in between the first pixel electrode 138 and each color filter 134 in the present invention. During the fabrication process of the present invention, the inorganic insulator is formed over the entire substrate to cover the first pixel electrode 138, the first gate pad electrode 142, and the first data pad electrode 146. Therefore, the Galvanic corrosion that may be caused by the developer patterning the color filter is prevented between the gate pad 106 and the first layers 138, 142 and 146 of the pixel and pad electrodes. Namely, the inorganic insulator serves as a protector covering the first pixel electrode 138, the first gate pad electrode 142, and the first data pad terminal 146 during the fabrication process. And then first portions of the inorganic insulator covering the first gate and data pad terminals 142 and 146 are removed after forming the color filters 134a-134c, while second portions of the inorganic insulator covering the first pixel electrode 138 are left. The method utilizing the inorganic insulator will be explained hereinafter with reference to FIGS. 5A-5H, 6A-6H and 7A-7H.

FIGS. 5A-5H are cross-sectional views along V-V of FIG. 4 showing exemplary fabrication process steps of a thin film transistor and a pixel electrode according to the present invention, FIGS. 6A-6H are cross sectional views along VI-VI of FIG. 4 showing exemplary fabrication process steps of a gate pad according to the present invention, and FIGS. 7A-7H are cross sectional views along VII-VII of FIG. 4 showing exemplary fabrication process steps of a data pad according to the present invention.

Figure 5A:
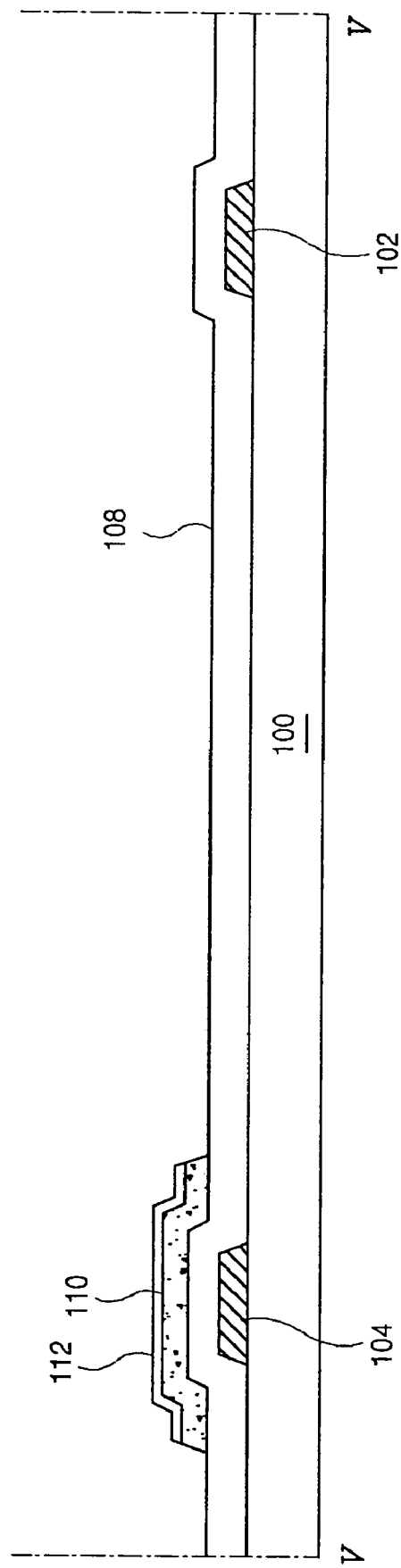
Figure 6A:
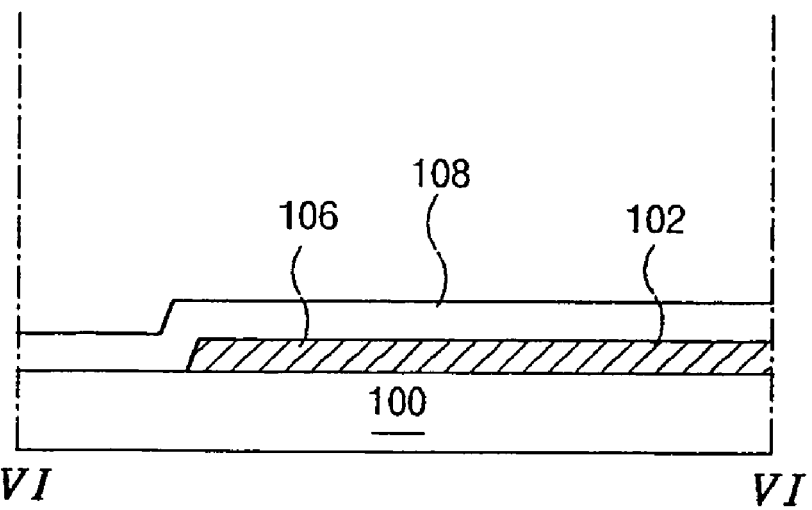
FIGS. 6A-6H are cross sectional views along VI-VI of FIG. 4 showing exemplary fabrication process steps according to the embodiment.
Figure 7A:
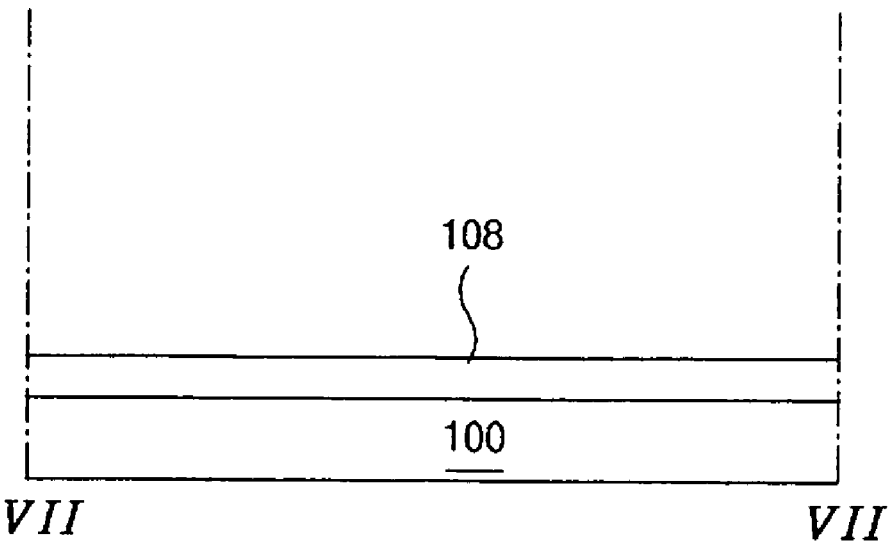
FIGS. 7A-7H are cross sectional views along VII-VII of FIG. 4 showing exemplary fabrication process steps according to the embodiment.

In FIGS. 5A, 6A, and 7A, a first metal layer may be deposited onto a surface of a substrate 100, and then patterned to form a gate line 102, a gate electrode 104, and a gate pad 106. As mentioned before, the gate pad 106 may be disposed at the end of the gate line 102, and the gate electrode 104 may extend from the gate line 102. The first metal layer may include aluminum-based material(s) having low electrical resistance in order to prevent signal delay. Although the aluminum-based material, aluminum (Al) or aluminum neodymium (AlNd), has the low electrical resistance, it is chemically weak against the developer patterning the color filter. And the aluminum-based material may cause the Galvanic reaction with a transparent conductive material, such as indium tin oxide or indium zinc oxide, which is used for the pixel electrode, whereby the gate pad 106 exposed in later process steps may be corroded and damaged.

After formation of the gate line 102, the gate electrode 104, and the gate pad 106 on the substrate 100, a gate insulation layer 108 (or a first insulating layer) may be formed on the substrate 100 to cover the gate line 102, the gate electrode 104, and the gate pad 106. The gate insulation layer 108 may include inorganic material(s), for example, silicon nitride ($SiN_x$) and silicon oxide ($SiO_2$). Then, an intrinsic amorphous silicon layer (e.g., a-Si:H) and a doped amorphous silicon layer (e.g., $n^+$ a-Si:H) may be sequentially deposited along an entire surface of the gate insulation layer 108, and may be simultaneously patterned using a mask process to form an active layer 110 and an ohmic contact layer 112. The ohmic contact layer 112 may be located on the active layer 110 over the gate electrode 104.

Figure 5B:
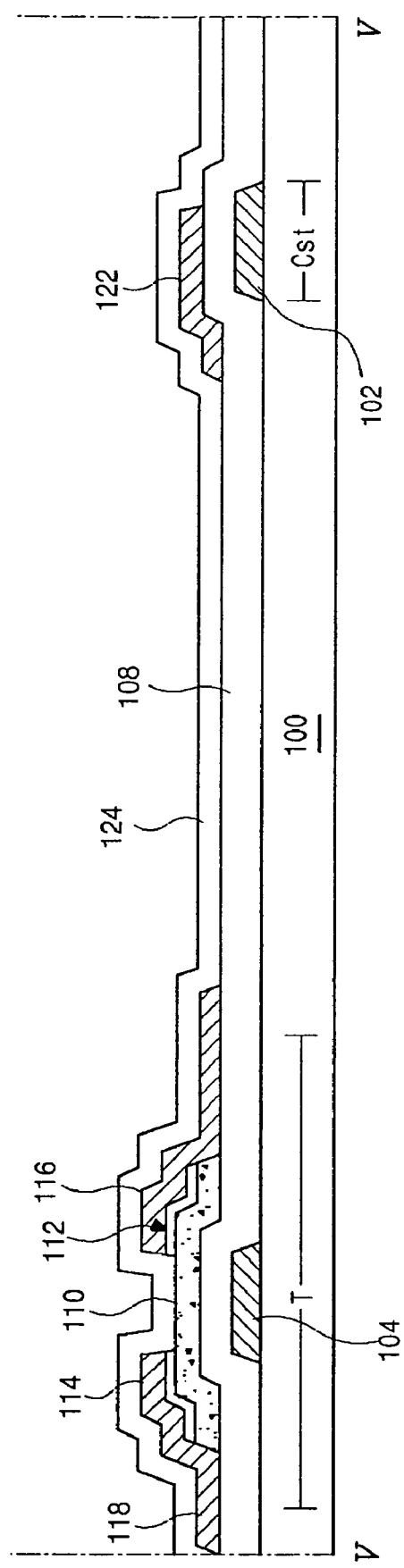
Figure 6B:
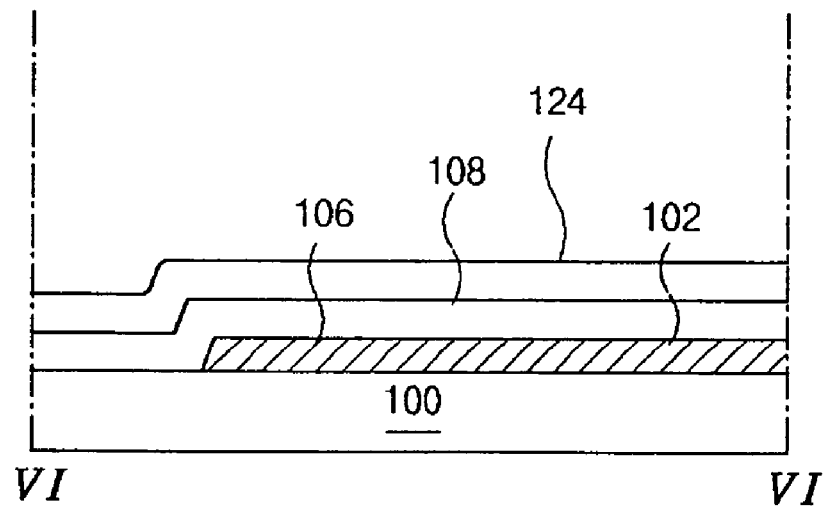
Figure 7B:
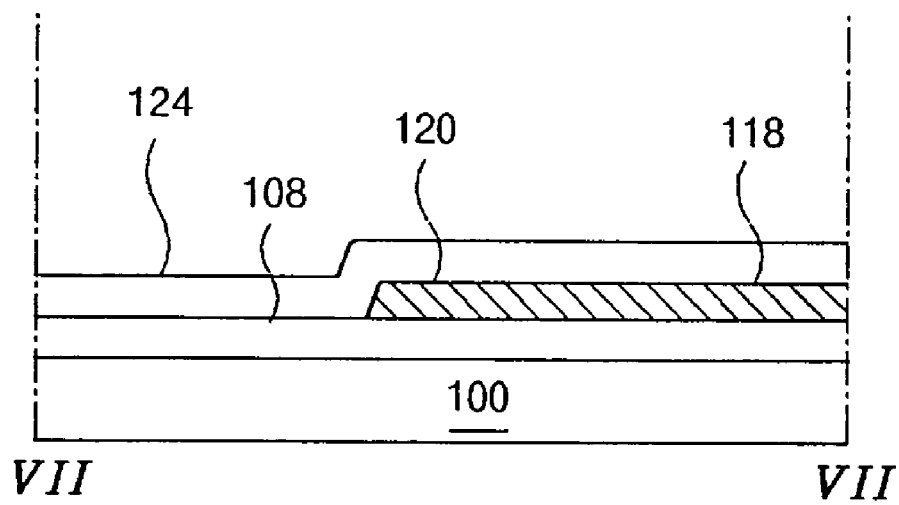

In FIGS. 5B, 6B, and 7B, after forming the active layer 110 and the ohmic contact layer 112, a second metal layer may be deposited over the substrate 100, and then patterned using a mask process to form a source electrode 114, a drain electrode 116, a data line 118, a storage metal layer 122, and a data pad 120. The second metal layer may include at least one of chromium (Cr), molybdenum (Mo), tungsten (W), titanium (Ti), copper (Cu), and an alloy of any combination thereof. The source electrode 114 may extend from the data line 118 and may contact one portion of the ohmic contact layer 112. The drain electrode 116 may be spaced apart from the source electrode 114 and may contact another portion of the ohmic contact layer 112. In addition, the storage metal layer 122 may overlap a portion of the gate line 102, and the data pad 120 may be connected to the data line 118 at the end of the data line 118.

Figure 1:
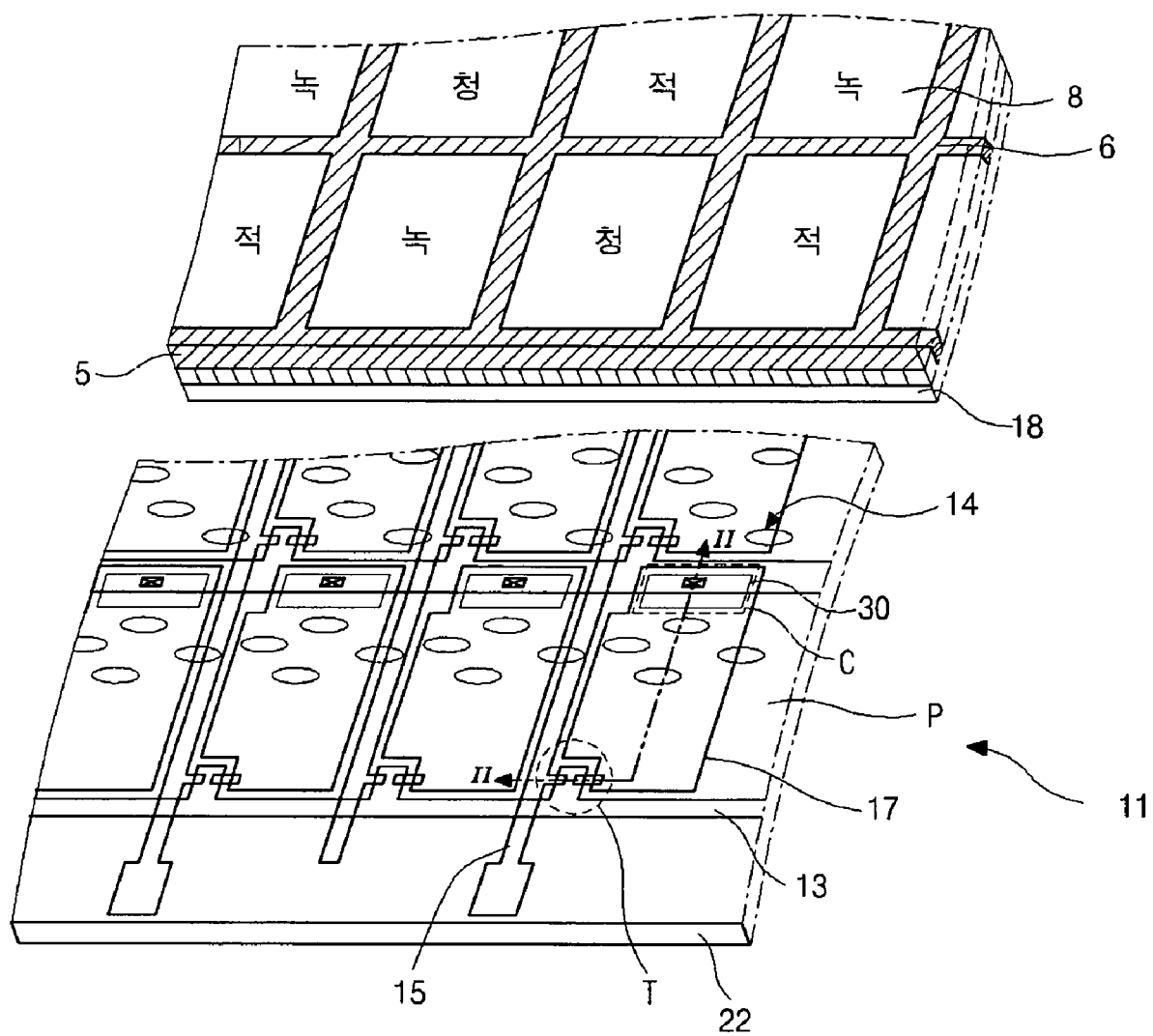
FIG. 1 is an expanded perspective view of a known liquid crystal display device.
Figure 2:
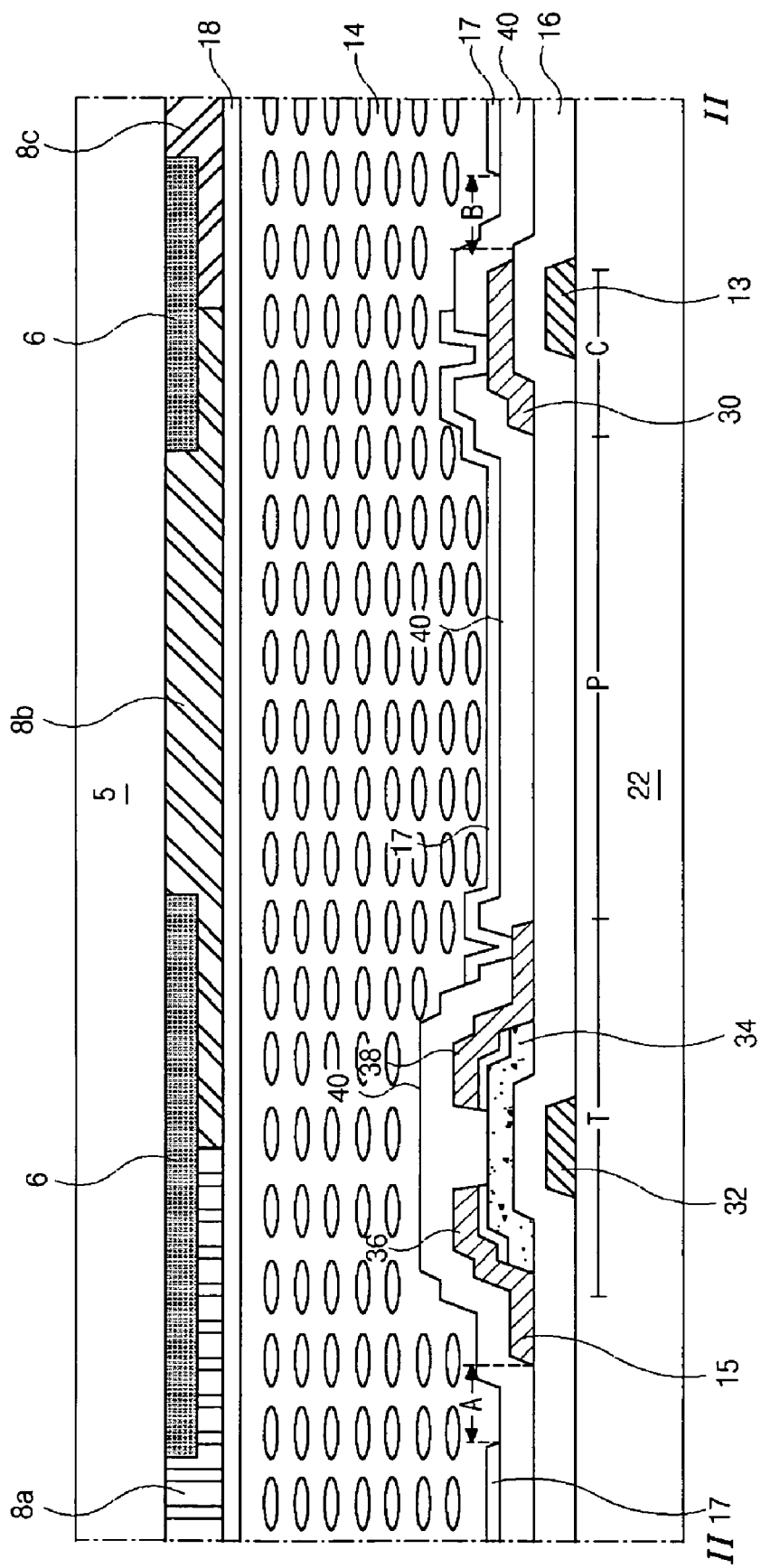
FIG. 2 is a schematic cross-sectional view along II-II of FIG. 1 showing a pixel of a known liquid crystal display device.
Figure 3:
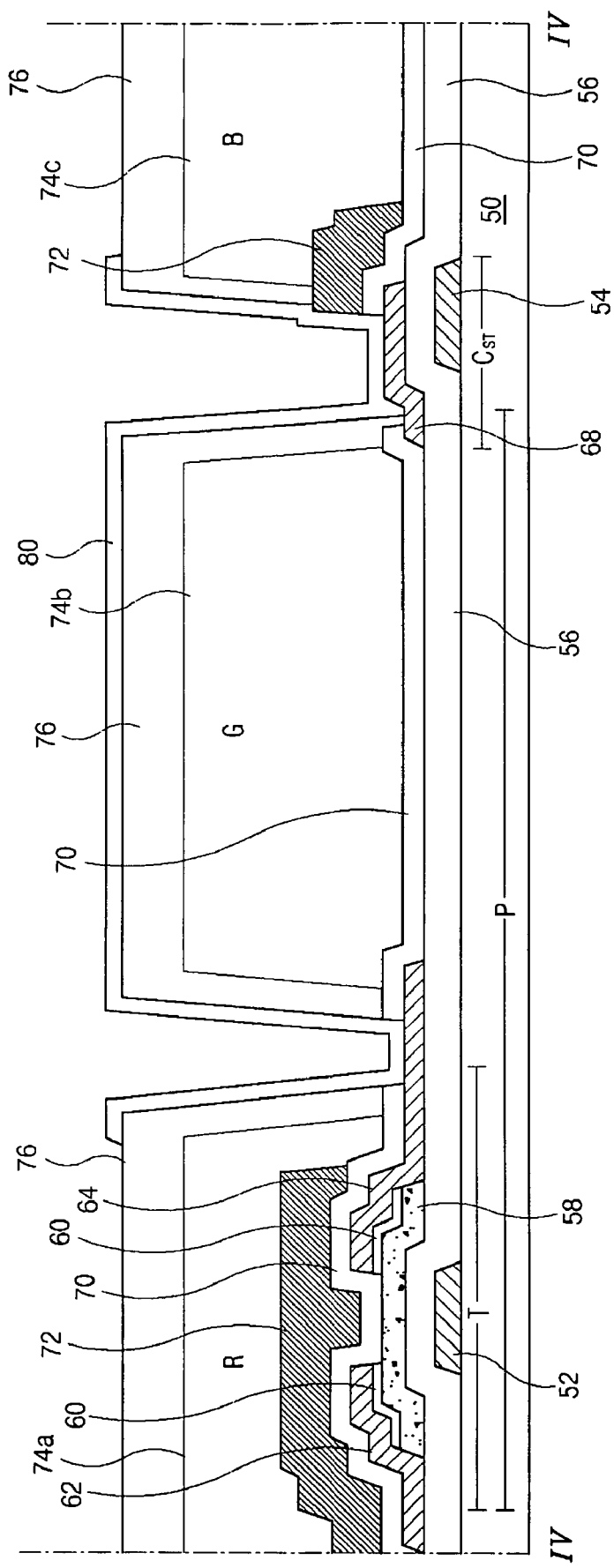
FIG. 3 is a cross sectional view illustrating a known array substrate having a color filter-on-thin film transistor (COT) structure.

Next, a portion of the ohmic contact layer 112 located between the source and drain electrodes 114 and 116 may be etched using the source and drain electrodes 114 and 116 as masks. Accordingly, a thin film transistor T and a storage capacitor $C_{st}$ may be formed, and the thin film transistor T may include the gate electrode 104, the active layer 110, the ohmic contact layer 112, the source electrode 114, and the drain electrode 116, and the storage capacitor $C_{ST}$ (in FIG. 3) may include of the gate line 102, the storage metal layer 122, and the interposed first insulating layer 108.

Then, a second insulating layer 124 may be deposited along an entire surface of the substrate 100 to cover the patterned second metal layer. The second insulating layer 124 may be formed of silicon nitride ($SiN_x$) or silicon oxide ($SiO_2$) and may enhance adhesion of an organic layer to be subsequently formed. The second insulating layer 124 prevents insufficient contact between the active layer 110 and the subsequently-formed organic layer. However, if contact between the active layer 110 and the subsequently-formed organic layer is sufficient, the second insulating layer 124 may not be necessary.

Figure 5C:
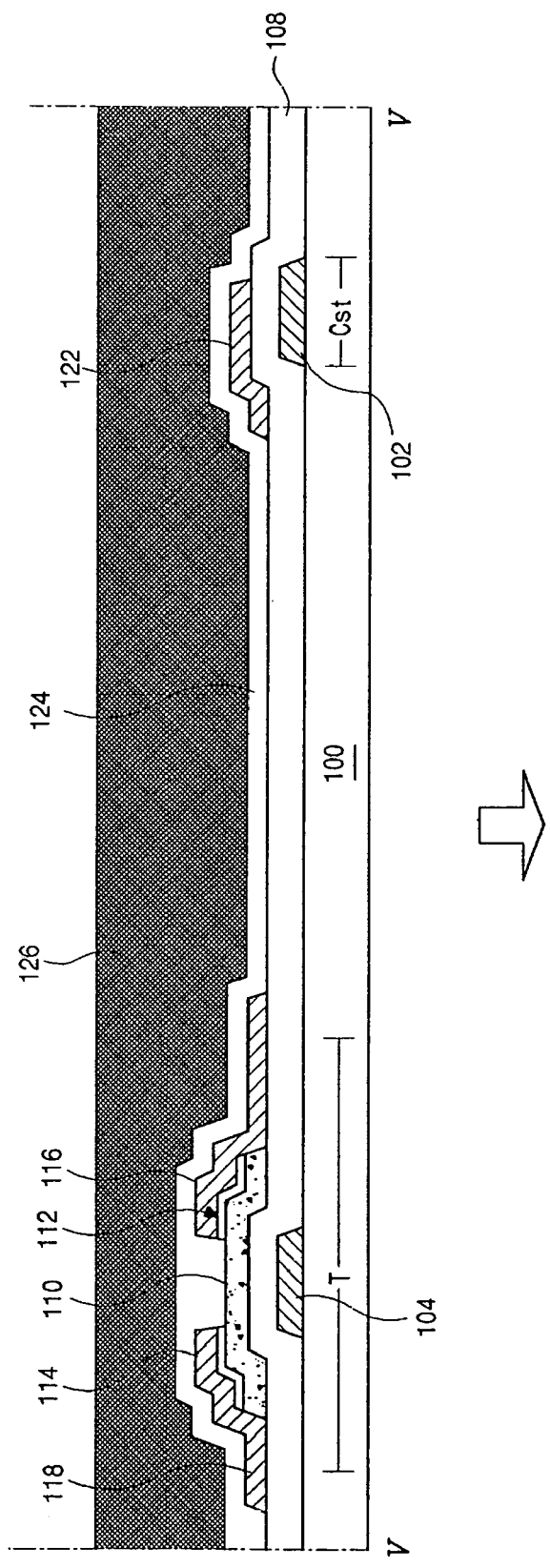
Figure 5C:
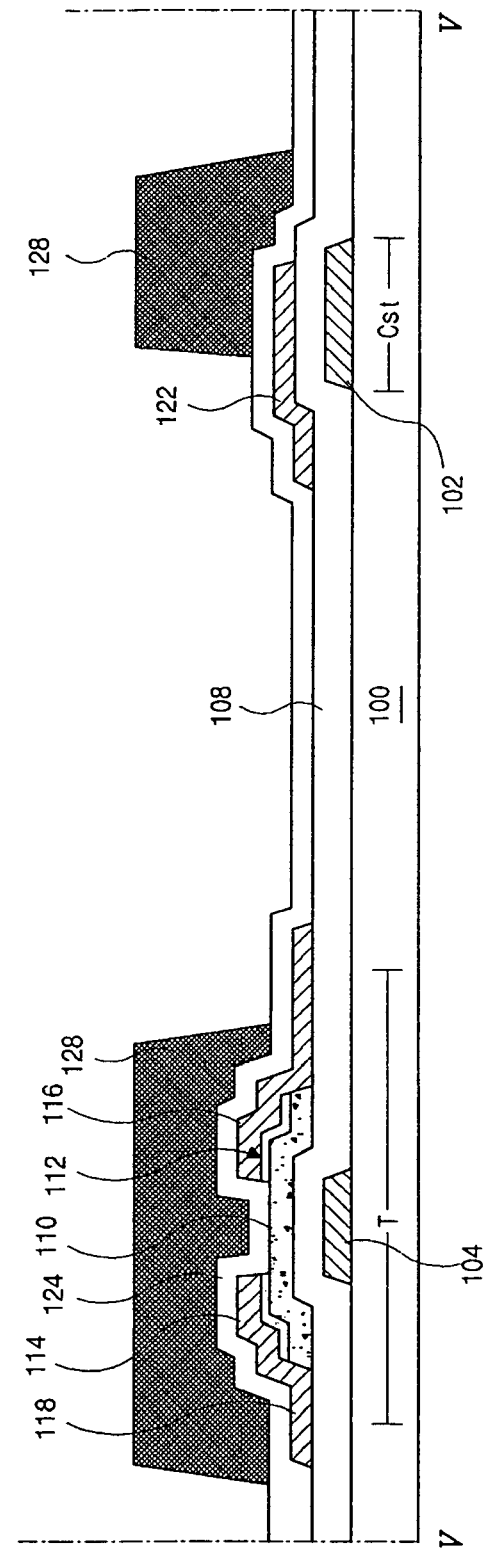
Figure 6C:
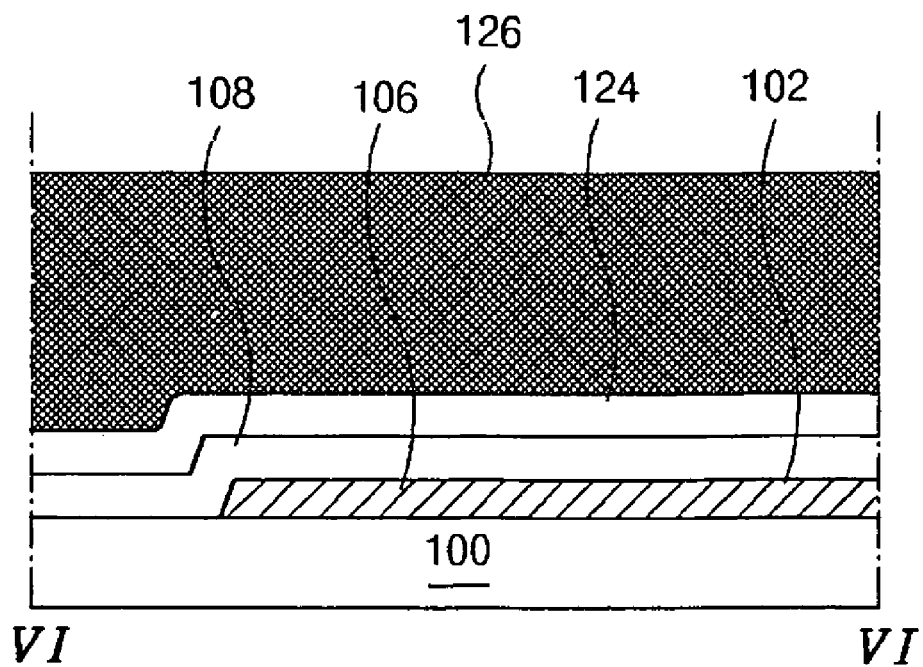
Figure 6C:
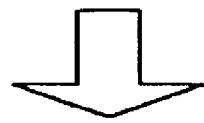
Figure 6C:
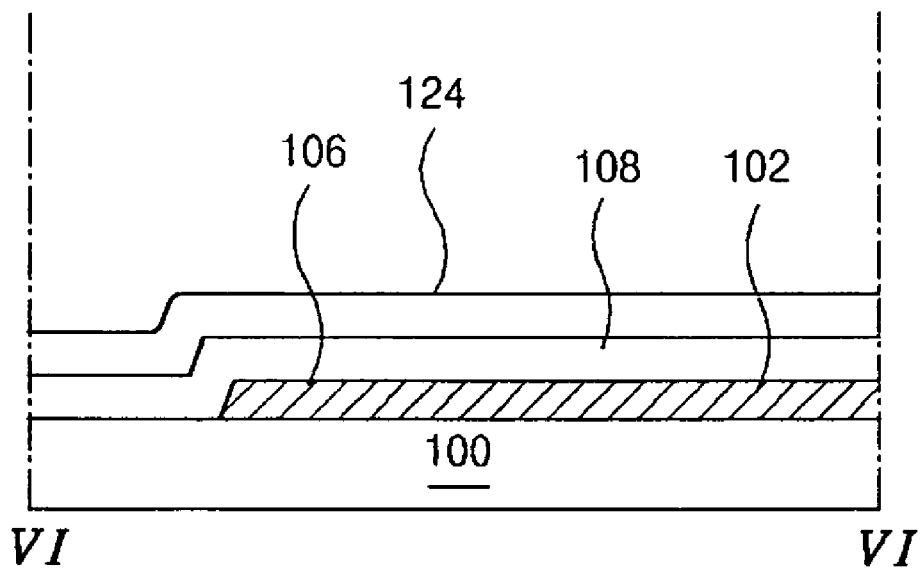
Figure 7C:
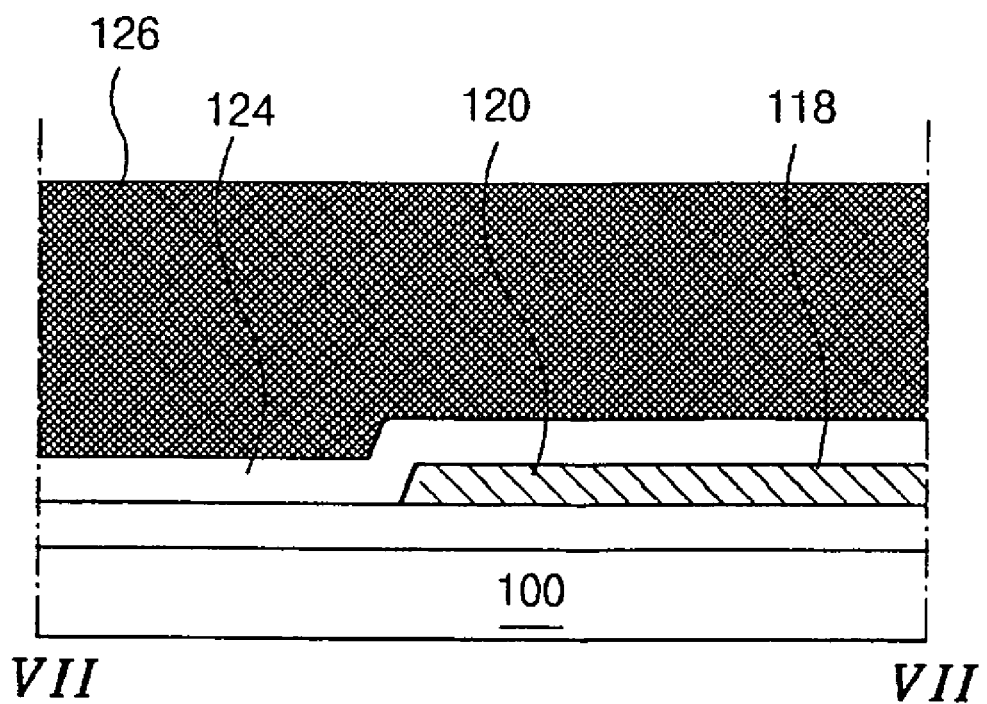
Figure 7C:
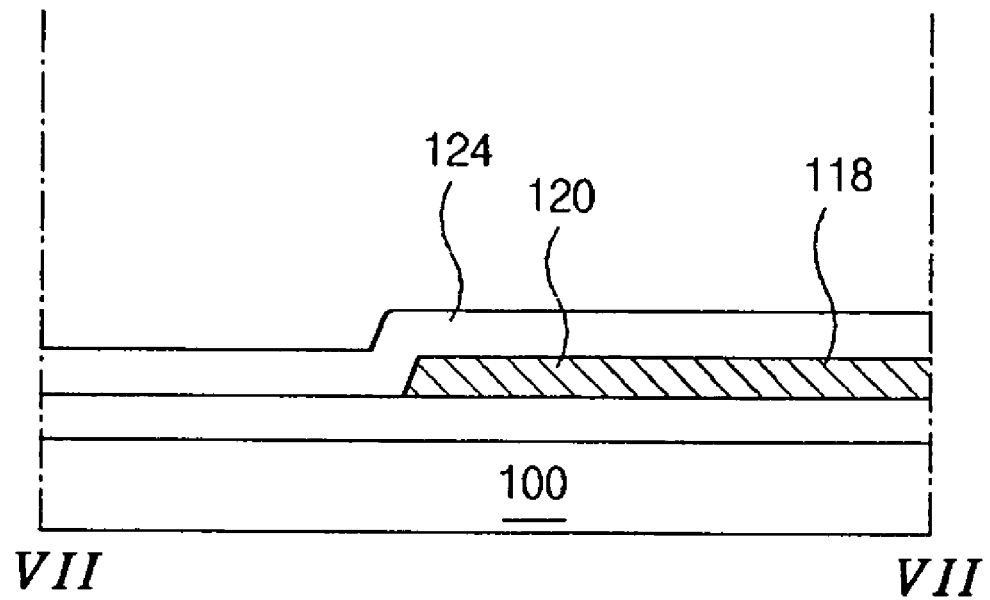

In FIGS. 5C, 6C, and 7C, an opaque organic material 126 having a low dielectric constant may be deposited on the second insulating layer 124. The opaque organic material 126 may have a black color to function as a black matrix. Then, the opaque organic material 126 formed on the second insulating layer 124 may be patterned using a mask process. Accordingly, a black matrix 128 may be formed over the thin film transistor T, the data line 118, and the gate line 102. Since the black matrix 128 includes organic material(s), it may provide protection to the thin film transistor T. In addition, the black matrix 128 may cover a portion of the storage metal layer 122, thereby protecting the storage capacitor $C_{st}$.

Figure 5D:
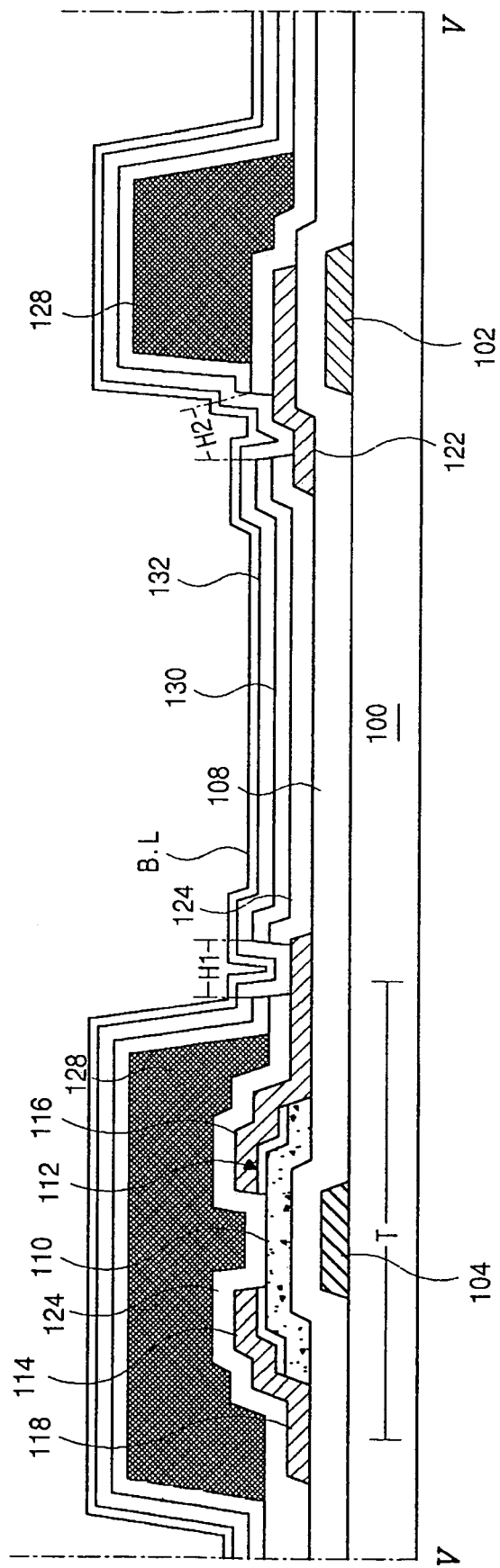
Figure 6D:
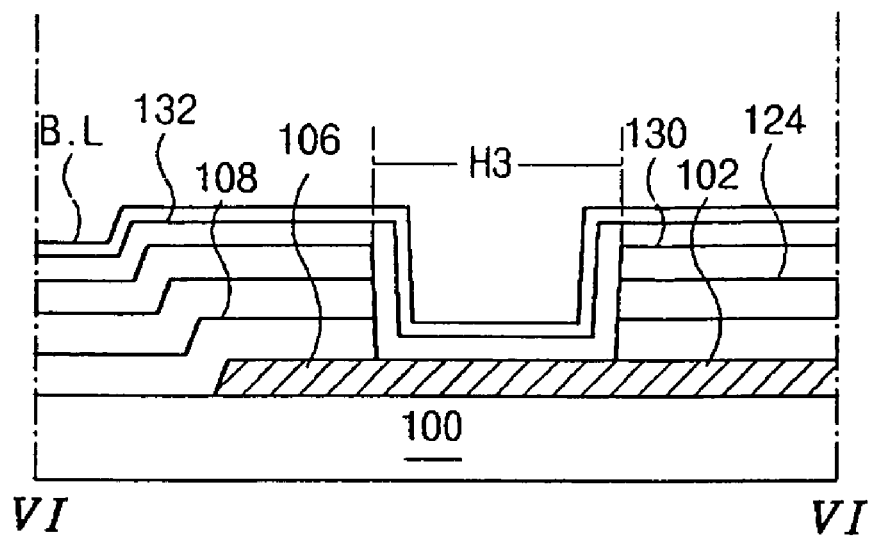
Figure 7D:
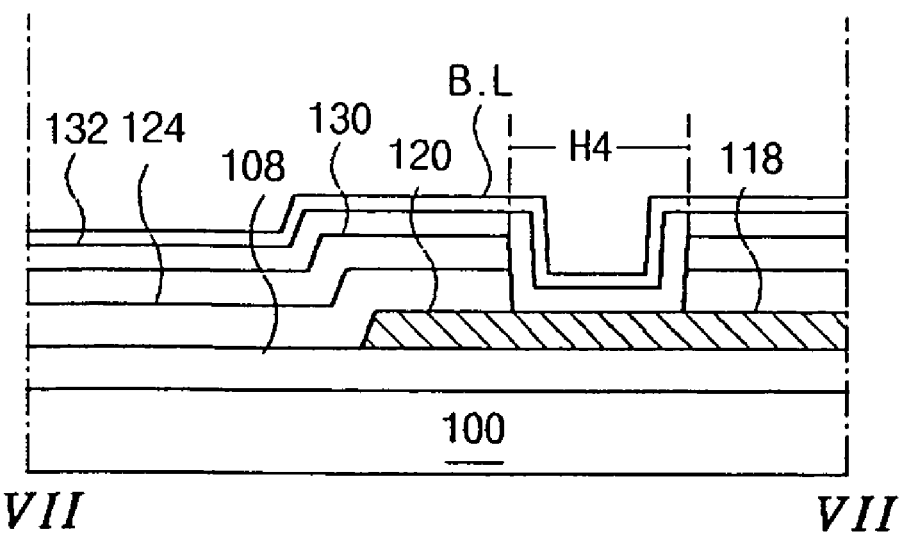

In FIGS. 5D, 6D, and 7D, a third insulating layer 130 may be formed along an entire surface of the substrate 100 to cover the black matrix 128. The third insulating layer 130 may include inorganic insulating material(s), such as silicon nitride ($SiN_x$) or silicon oxide ($SiO_2$). After forming the third insulating layer 130, the first to third insulating layers 108, 124 and 130 are simultaneously patterned to form first to fourth contact holes H1-H4. The first and second contact holes H1 and H2 penetrate both the second and third insulating layers 124 and 130, and expose a portion of the drain electrode 116 and a portion of the storage metal layer 122, respectively. The third contact hole H3 penetrates the first to third insulating layers 108, 124 and 130, and exposes a portion of the gate pad 106. In addition, the fourth contact hole H4 penetrates the second and third insulating layers 124 and 130, and exposes a portion of the data pad 120.

After patterning the insulators, a first transparent conductive layer 132 may be formed by depositing at least one of indium tin oxide (ITO) and indium zinc oxide (IZO) along an entire surface of the substrate 100 to cover the patterned third insulating layer 130 and to contact the exposed portions of the drain electrode 106, storage metal layer 122, gate pad 106 and data pad 120. Furthermore, a buffer layer B.L is formed on the first transparent conductive layer 132. The buffer layer B.L may include inorganic insulating material(s), such as silicon nitride ($SiN_x$) or silicon oxide ($SiO_2$), and may have a thickness of 300 to 500 angstroms (Å). In the present invention, the buffer layer B.L protects the gate pad 106 from a developer patterning subsequently-formed color filters. Namely, the developer may cause the Galvanic reaction between the gate pad 106 and the first transparent conductive layer 132, and may cause some damage to the gate pad 106 and first transparent conductive layer 132. Therefore, the buffer layer B.L is formed on the whole surface of the first transparent conductive layer 132 to prevent the developer from coming in contact with the first transparent conductive layer 132 and the gate pad 106. Furthermore, since the buffer layer B.L protects the underlying first transparent conductive layer 132 from the Galvanic corrosion, it improves contact between the first transparent conductive layer 132 and a later-formed second transparent conductive layer.

Figure 5E:
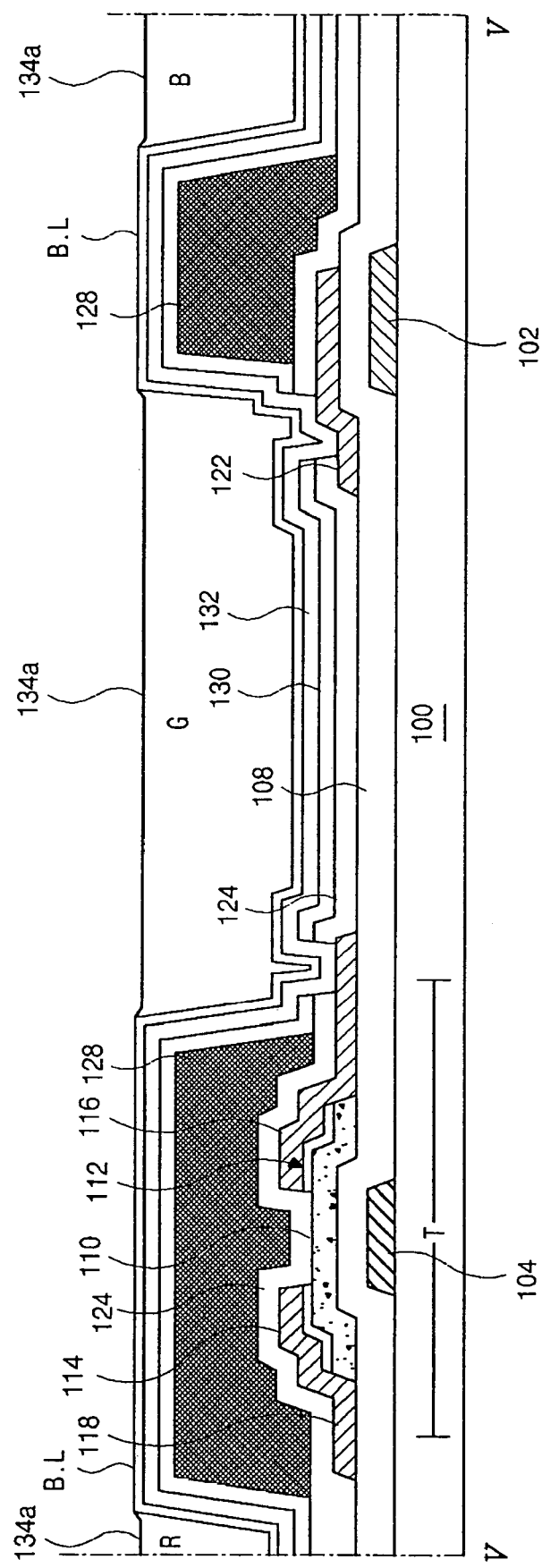
Figure 6E:
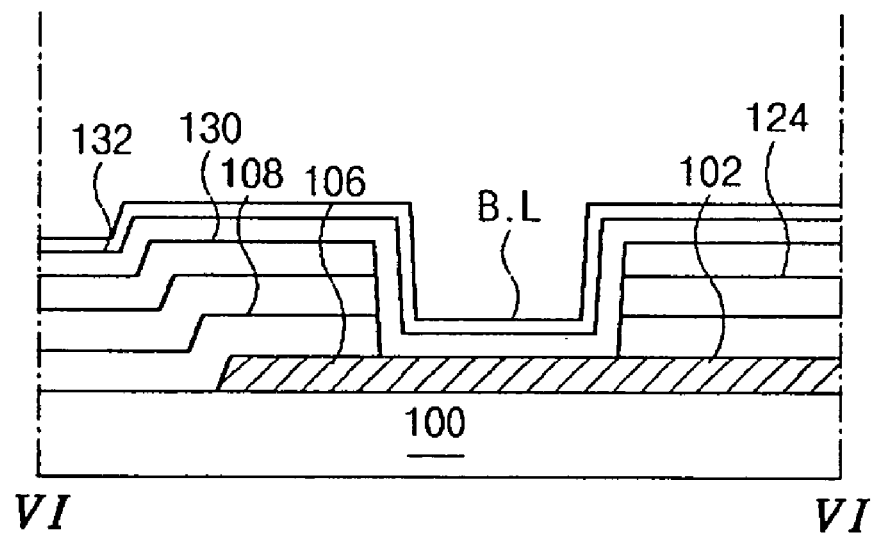
Figure 7E:
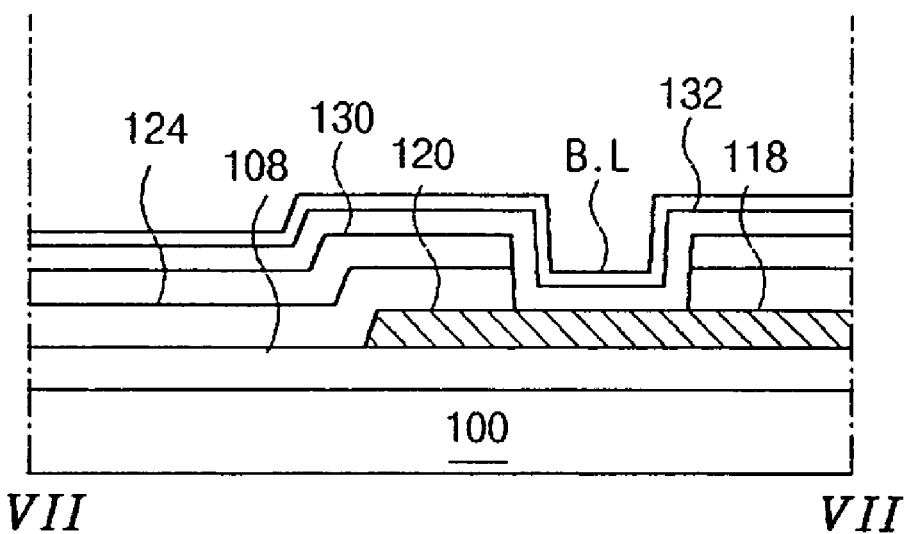

In FIGS. 5E, 6E and 7E, color resin may be formed on the buffer layer B.L and then developed to form color filters 134a, 134b, and 134c having red (R), green (G), and blue (B) colors, respectively. The color filters 134a, 134b, and 134c, which may provide for displaying a full spectrum of colors, may be formed within the pixel regions P on the buffer layer B.L. When developing the color resin, the buffer layer B.L may prevent a developing solution (i.e., a developer) used to pattern the color filters 134a, 134b, and 134c from penetrating into underlying first transparent conductive layer 132. Furthermore, the chemically weak gate line 102, gate electrode 104, and gate pad 106 may be protected from the developer by the buffer layer B.L.

Figure 5F:
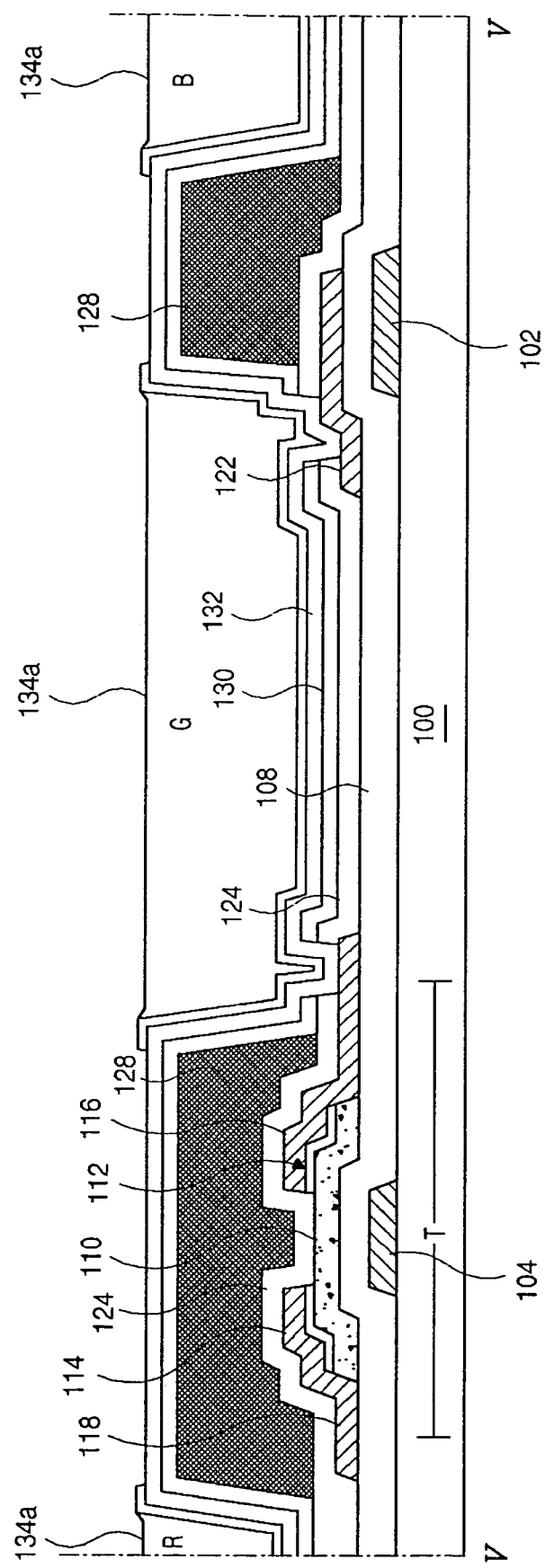
Figure 6F:
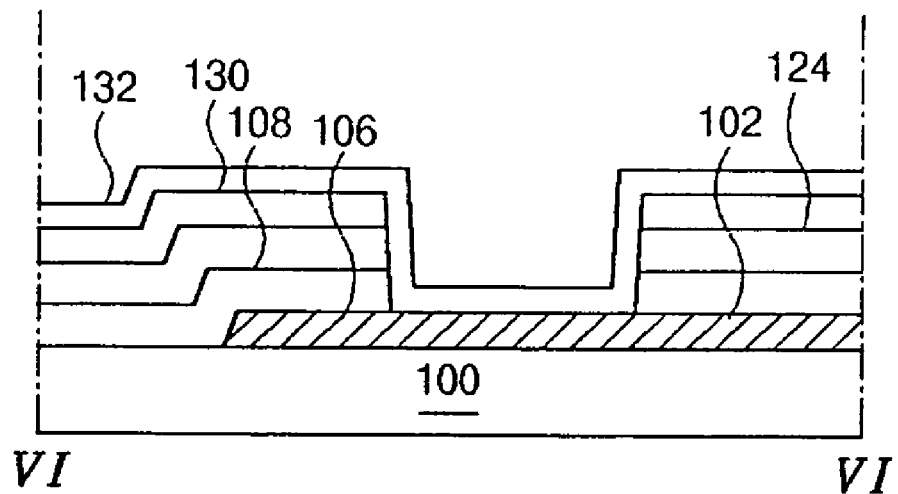
Figure 7F:
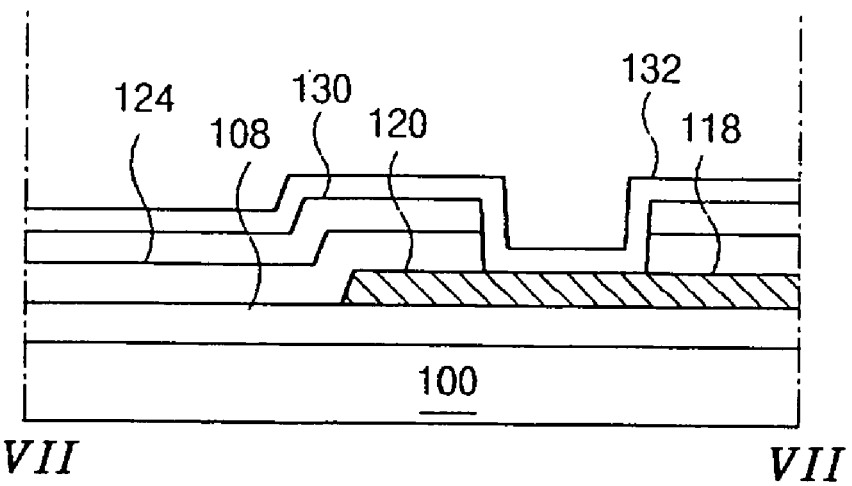

Now in FIGS. 5F, 6F and 7F, exposed portions of the buffer layer B.L are etched to expose the underlying first transparent conductive layer 132. Namely, the portions of the buffer layer B.L, which are not under the color filters 134a-134c, are removed. More specifically, the buffer layer B.L over the gate and data pads 106 and 120 is completely removed. Since the buffer layer B.L protected the first transparent conductive layer 132 from the developer, the surface of the exposed portions of the first transparent conductive layer 132 is in excellent condition.

Figure 6G:
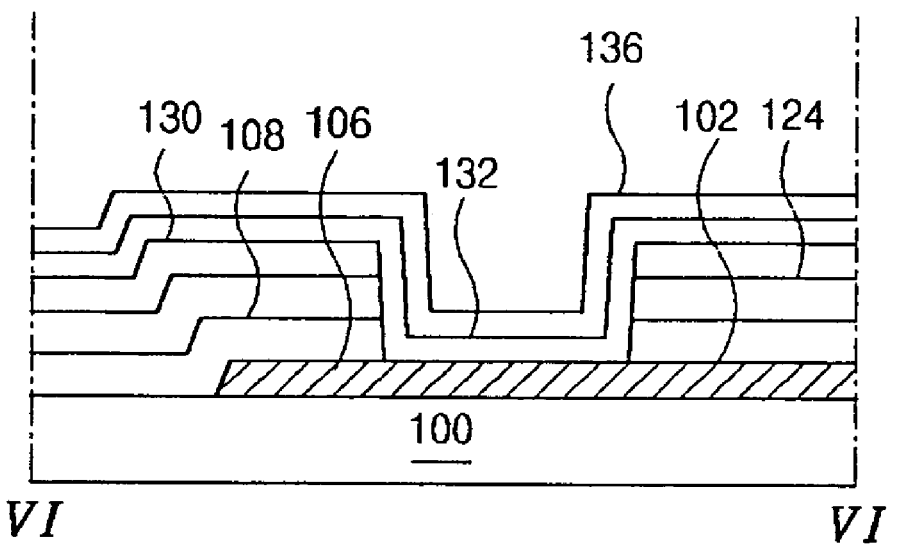
Figure 7G:
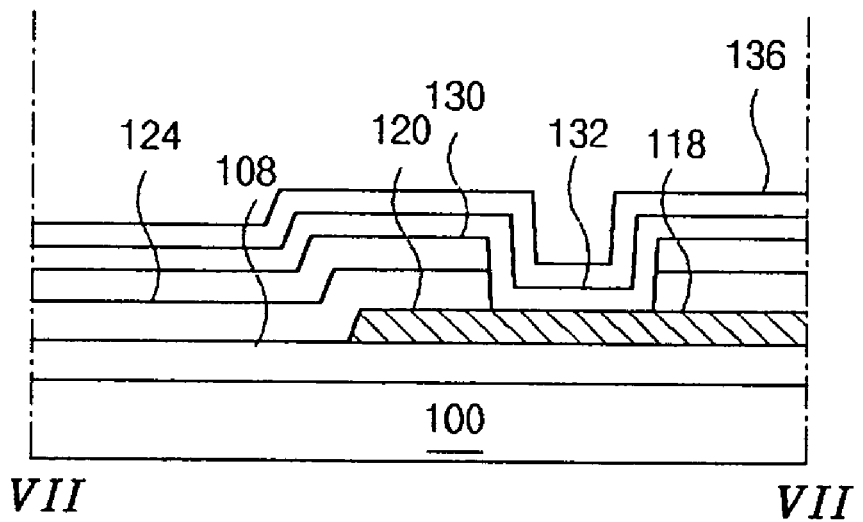

In FIGS. 5G, 6G and 7G, after patterning the buffer layer B.L, a second transparent conductive layer 136 may be formed along an entire surface of the substrate 100 to contact each of the color filters 134a, 134b, and 134c and the exposed portions of the first transparent conductive layer 132. The second transparent conductive layer 136 may include at least one of indium tin oxide and indium zinc oxide similar to the first transparent conductive layer 132. In FIG. 5G, the second transparent conductive layer 136 may contact the first transparent conductive layer 132 at both sides of each of the color filters 134a, 134b, and 134c.

Figure 5H:
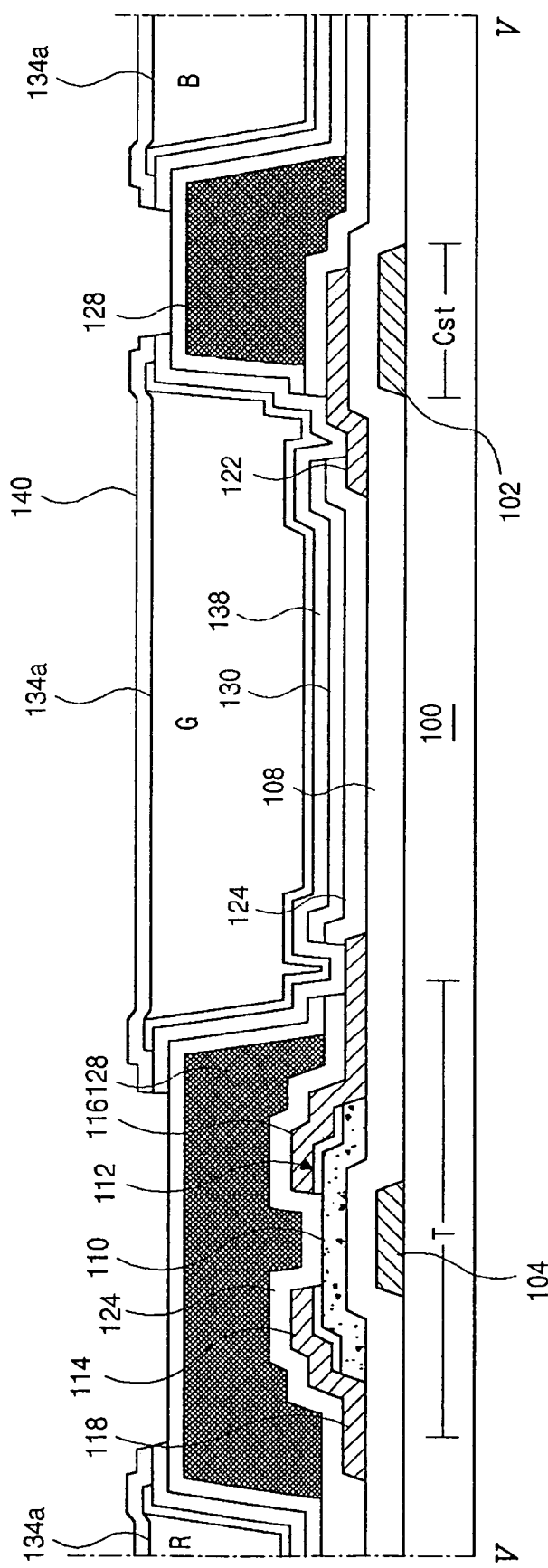
Figure 6H:
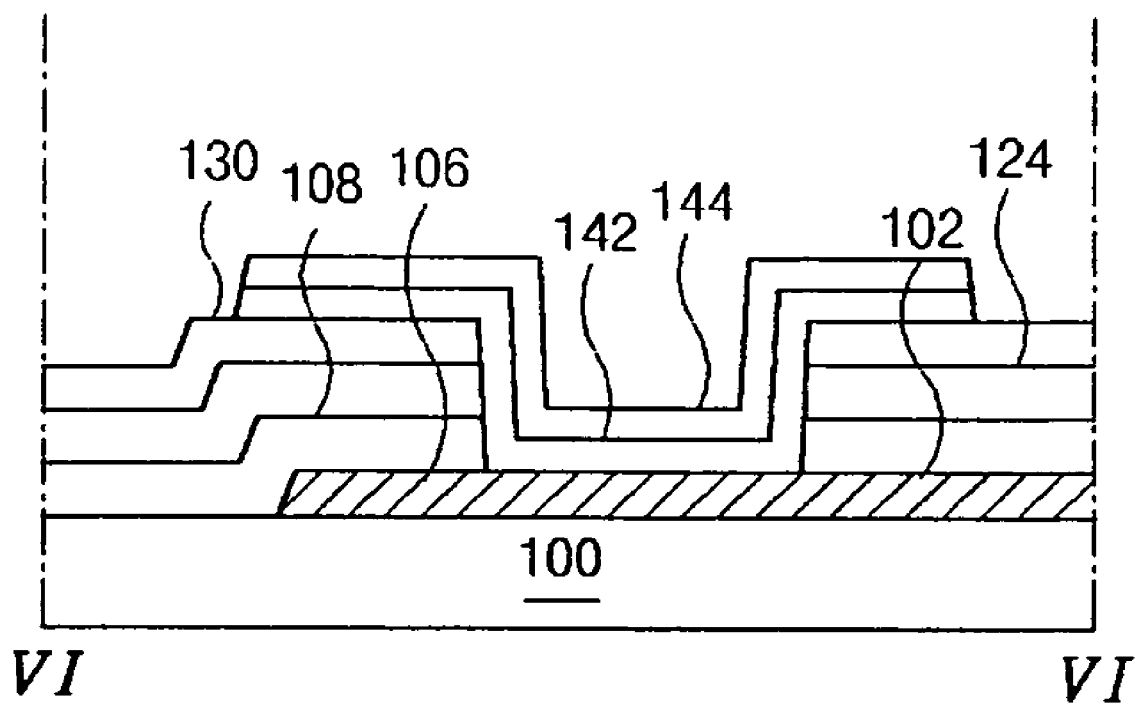
Figure 7H:
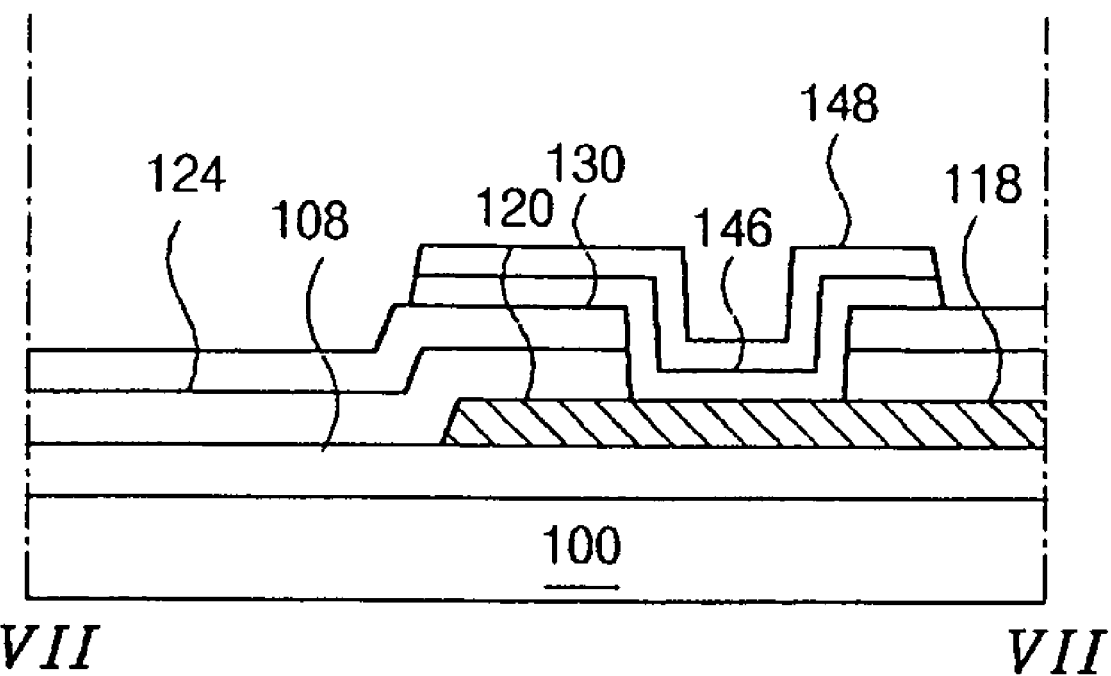

Next in FIGS. 5H, 6H and 7H, the first and second transparent conductive layers 132 and 136 may be simultaneously patterned to form a double-layered pixel electrode (i.e., sandwich pixel electrode) that may include the first and second pixel electrodes 138 and 140, as shown in FIG. 5H. The second pixel electrode 140 may contact the first pixel electrode 138 at both sides of each of the color filters 134a-134c. Accordingly, the sandwich pixel electrode may contact the thin film transistor T and may be connected in parallel to the storage capacitor $C_{st}$.

In FIGS. 6G and 7G, when forming the sandwich pixel electrode of the first and second pixel electrodes 138 and 140 (in FIG. 5G), the first and second transparent conductive layers 132 and 136 disposed over the gate and data pads 106 and 120 also may be patterned to form a double-layered gate pad terminal and a double-layered data pad terminal, respectively, over the gate pad 106 and over the data pad 120. The double-layered gate pad terminal may comprise the first and second gate pad electrodes 142 and 144, and the double-layered data pad terminal may comprise the first and second data pad electrodes 146 and 148.

Accordingly, the array substrate for use in a liquid crystal display device, and more particularly, the array substrate having the COT structure may be formed using the above mentioned fabrication processes. Since the overcoat layer is utilized during the fabrication process of the present invention, the fabrication cost is decreased and the quality of the array substrate is enhanced. Furthermore, since a developer used for forming the color filter is safely controlled during the process by a buffer layer having a thickness of 300-500 angstroms, the gate pad and other layer elements are not damaged during the fabrication process, thereby stabilizing the fabrication process of the array substrate, simplifying the fabrication process, and reducing production costs. Moreover, since the black matrix and color filters are formed on the array substrate, an aligning margin between lower and upper substrates may not be necessary, thereby increasing an aperture ratio. In addition, the buffer layer protects the underlying the first transparent conductive layer, permitting improvement of the contact properties between the first and second transparent conductive layers. When simultaneously patterning the first and second transparent conductive layers, the critical dimension (CD) loss can be minimized.

It will be apparent to those skilled in the art that various modifications and variations can be made in the array substrate for liquid crystal display device and method of fabricating the same of the present invention without departing from the spirit or scope of the invention. Thus, it is intended that the present invention covers the modifications and variations of this invention provided they come within the scope of the appended claims and their equivalents.

What is claimed is:

1. A method of forming an array substrate for a liquid crystal display device, comprising:

forming a gate line on the substrate along a first direction, a gate pad at one end of the gate line, and a gate electrode extending from the gate line;

forming a first gate insulating layer on the substrate to cover the gate line, the gate pad, and the gate electrode;

forming an active layer of unintentionally doped amorphous silicon and an ohmic contact layer of intentionally doped amorphous silicon layer sequentially on the first gate insulating layer over the gate electrode;

forming a data line, a data pad, a source electrode, and a drain electrode, the data line disposed extending along a second direction to perpendicularly cross the gate line to define a pixel region, the data pad disposed at one end of the data line, the source electrode extending from the data line on a first portion of the ohmic contact layer, and the drain electrode spaced apart from the source electrode on a second portion of the ohmic contact layer to form a thin film transistor;

forming a second insulating layer over an entire surface of the substrate to cover the thin film transistor;

forming a black matrix on the second insulating layer to cover the thin film transistor, the gate line, and the data line except a portion of the drain electrode;

forming a third insulating layer over the entire surface of the substrate to cover the black matrix;

patterning the first, second, and third insulating layers to form first, second and third contact holes, the first contact hole exposing the portion of the drain electrode, the second contact hole exposing a portion of the gate pad, and the third contact hole exposing a portion of the data pad;

forming a first transparent conductive layer over the entire surface of the substrate to cover the patterned third insulating layer and contact the exposed portions of the drain electrode, gate pad and data pad;

forming a buffer layer on the first transparent conductive layer;

forming a color filter on the buffer layer within the pixel region;

etching portions of the buffer layer exposed by the color filter to reveal portions of the first transparent conductive layer;

forming a second transparent conductive layer over the entire surface of the substrate to cover the color filter and the revealed portions of the first transparent conductive layer; and patterning the first and second transparent conductive layers to form first and second pixel electrodes, a gate pad terminal, and a data pad terminal.

2. The method according to claim 1, wherein the black matrix comprises an opaque organic material having a low dielectric constant.

3. The method according to claim 1, wherein the color filter comprises red, green, or blue colors.

4. The method according to claim 1, wherein the buffer layer comprises an inorganic material selected from a group consisting of silicon nitride and silicon oxide.

5. The method according to claim 1, wherein the buffer layer has a thickness of 300 to 500 angstroms.

6. The method according to claim 1, wherein the thin film transistor comprises the gate electrode, the active layer, the ohmic contact layer, the source electrode, and the drain electrode.

7. The method according to claim 1, wherein the first and second pixel electrodes form a sandwich pixel electrode structure.

8. The method according to claim 1, wherein the color filter is interposed between the first and second pixel electrodes.

9. The method according to claim 1, wherein the second insulating layer is interposed between the thin film transistor and the black matrix.

10. The method according to claim 1, wherein each of the first, second, and third insulating layers comprises silicon nitride or silicon oxide.

11. The method according to claim 1, wherein each of the first and second transparent electrode layers comprises indium tin oxide or indium zinc oxide.

12. The method according to claim 1, wherein forming the data line includes forming a storage metal layer on the first insulating layer over the gate line.

13. The method according to claim 12, wherein patterning the first, second and third insulating layers forms a fourth contact hole exposing a portion of the storage metal layer.

14. The method according to claim 13, wherein the first pixel electrode contacts the exposed portion of the storage metal layer.

15. The method according to claim 14, wherein the storage metal layer and a portion of the gate line constitute a storage capacitor with the first insulating layer interposed between the storage metal layer and the gate line.

16. The method according to claim 12, wherein the storage metal layer has an isolated island shape.

17. A method of forming an array substrate for a liquid crystal display device, comprising:
forming a buffer layer on a first transparent conductive layer, the first transparent conductive layer contacting a drain electrode;
forming a color filter on the buffer layer;
removing portions of the buffer layer exposed by the color filter to reveal portions of the first transparent conductive layer;
covering the color filter and the revealed portions of the first transparent conductive layer with a second transparent conductive layer; and
patterning the first and second transparent conductive layers to form first and second pixel electrodes.

18. The method according to claim 17, further comprising limiting a thickness of the buffer layer to about 300-500 angstroms.

19. The method according to claim 17, wherein patterning the first and second transparent conductive layers also forms a gate pad terminal and a data pad terminal having multiple conductive layers.

20. The method according to claim 17, further comprising limiting damage to a gate line, a gate electrode, and the gate pad and the first transparent conductive layer caused by a developer used during formation of the color filter by using the buffer layer.

21. The method according to claim 17, further comprising improving contact properties between the first and second transparent conductive layers by protecting the first transparent conductive layer from damage when forming the color filter using the buffer layer.

22. The method according to claim 17, further comprising completely removing the buffer layer on gate and data pads formed using the first transparent conductive layer to expose the gate and data pads and permitting the gate and data pads to be contacted by the second transparent conductive layer.

23. The method according to claim 17, further comprising forming a storage capacitor using a gate line, conductive storage layer and insulating layer between the gate line and storage layer.

24. The method according to claim 23, further comprising forming a contact hole exposing a portion of the storage layer prior to forming the buffer layer.

25. The method according to claim 24, further comprising contacting the exposed portion of the storage layer using the first transparent conductive layer.

26. The method according to claim 17, further comprising forming all contact holes in the substrate prior to forming the buffer layer.

27. The method according to claim 26, further comprising contacting layers exposed by all of the contact holes prior to forming the buffer layer.

28. The method according to claim 27, further comprising protecting a layer contacting the layers exposed by all of the contact holes from subsequent undesired processing using the buffer layer.

29. The method of claim 17, wherein the transparent conductive layer further contacts gate and data pads through multiple insulating layers disposed on the drain electrode and the gate and data pads.

30. The method of claim 29, wherein the color filter is formed between portions of a black matrix.

31. A method of forming an array substrate for a liquid crystal display device, comprising:
forming a buffer layer on a first transparent conductive layer that contacts a drain electrode;
forming a color filter on the buffer layer between portions of a black matrix;
removing portions of the buffer layer exposed by the color filter to reveal portions of the first transparent conductive layer;
covering the color filter and the revealed portions of the first transparent conductive layer with a second transparent conductive layer; and
patterning the first and second transparent conductive layers to form first and second pixel electrodes.

* * * * *